United States Patent [19]
Tucci

[11] Patent Number: 5,097,489
[45] Date of Patent: Mar. 17, 1992

[54] METHOD FOR INCORPORATING WINDOW STROBE IN A DATA SYNCHRONIZER

[76] Inventor: Patrick A. Tucci, 1314 Happy Valley Ave., San Jose, Calif. 95129

[21] Appl. No.: 354,058

[22] Filed: May 19, 1989

[51] Int. Cl.⁵ ............................................. H04L 7/02
[52] U.S. Cl. ...................................... 375/120; 328/55
[58] Field of Search ............................... 375/118–120, 375/81; 331/1 A, 14, 17, 25; 328/55; 360/51

[56] References Cited

U.S. PATENT DOCUMENTS

| | | | |
|---|---|---|---|
| 4,580,100 | 4/1986 | Suzuki et al. | 331/1 A |
| 4,680,780 | 7/1987 | Agoston et al. | 375/120 |
| 4,750,193 | 6/1988 | Bailey | 375/120 |
| 4,814,726 | 3/1989 | Byrd et al. | 331/17 |

Primary Examiner—Robert L. Griffin
Assistant Examiner—Marianne Huseman
Attorney, Agent, or Firm—Lee Patch; Gail W. Woodward; Michael Glenn

[57] ABSTRACT

A method and structure for performing data synchronization by delaying the input data for substantially one-half of the VCO signal period and then comparing the phase of the delayed input data to the VCO signal. The phase difference is filtered and controls the frequency of the VCO signal to align the VCO signal with the delayed input data. The delayed input data is clocked into a flip-flop on the opposite phase of the VCO signal to produce an output signal. In a preferred embodiment the delay of the input data for phase comparison, and the delay of the input data for the output flip-flop can be independently selected.

10 Claims, 4 Drawing Sheets

METHOD FOR INCORPORATING WINDOW STROBE IN A DATA SYNCHRONIZER

BACKGROUND OF THE INVENTION

This invention relates to a data synchronizer as might be used in reading data from a computer disk drive, or in receiving data over a serial data communications link.

As an example, FIG. 1 illustrates the process of reading data from a computer disk drive. Flux reversals 10 on the rotating magnetic disk 12 are sensed by a read head 14 and amplified by read/write amplifier 16. The analog signal 18 is then passed through a pulse peak detector 20 to generate a stream of digital input data 22 in which the rising edge of a pulse represents a flux reversal 10.

The time positions of pulses in the input data 22 can vary or "jitter" due to difficulty in precisely replicating the time positions of flux reversals 10 on the disk 12. A data synchronizer 24 functions to synchronize the input data 22 into output data 26 of evenly timed "windows" in which a pulse is present or absent.

Completing FIG. 1, a decoder 28 converts the output data 26 into synchronous clock signals 30 and NRZ-encoded data signals 32 for processing by a disk data controller 34 and eventual use by a computer system 36.

Another example is the receiving of data over a serial data communications link. The time position of pulses in the received data can vary or "jitter" due to frequency-dependent variations in the communications channel, or due to difficulty in precisely detecting the time positions of transitions in the received signal. Again, a data synchronizer can be used to synchronize the received data into output data of evenly timed windows in which data appears.

FIG. 2 shows a known approach to performing the synchronization function of the data synchronizer 24. A voltage controlled oscillator (VCO) signal 38 is produced at the mean data rate of the input data 22. The frequency of the VCO signal 38 and its phase, the time position of its rising or falling edges, are locked in position relative to the long term average position of pulses in the input data 22 by a phase lock loop (PLL) which compares the input data 22 and the VCO signal 38 and adjusts the frequency of the VCO signal 38 to correct any deviation.

It is common to lock a rising edge of the VCO signal 38 to the center of the pulse positions of the input data 22. This can be done by locking the VCO signal 38 to the input data 22 delayed for a time period of one half the period of the VCO signal 38.

In this way, the VCO signal 38 defines a "window" 40 for receiving a pulse in the input data 22, with the rising edge of the VCO signal 38 defining a nominal window center 44, and the falling edge of the VCO signal 38 defining the end of one window and the start of the next window.

When there is a pulse in the input data 22 anywhere within a window 40, the rising edge of the VCO signal pulse can capture the pulse. This is commonly done by applying the input data 22 to the data input of an edge triggered flip-flop which is clocked or enabled by the VCO signal 38. If there is a data pulse in the input data 22, when the VCO signal 38 clocks the flip-flop, the flip-flop will change state. If there is no pulse in the input data 22, the flip-flop will not change state when clocked by the VCO signal 38.

In this way, the state of the flip-flop can be read to produce output data 26. Output data 26 corresponds to the input data 22, but is delayed by up to one window period, and has no jitter since it is synchronized to the VCO signal 38.

The time position of a pulse in the input data 22 can vary or "jitter" early or late within a window 40. An early pulse 42 has its rising edge ahead of the nominal window center 44. A late pulse 46 has its rising edge after the nominal window center 44. It is desirable to recognize pulses occurring anywhere within the window. To accomplish this, it is important that the nominal window center 44 occur exactly one-half way through the window 40. Any centering error reduces the ability to detect very early or very late pulses.

It is also desirable to have a "strobe" function in which the window 40 can be intentionally moved early or late with respect to the nominal window center 44. This strobe function can be used to compensate for windows 40 which were not accurately centered, or to recover data which consistently occurs shifted with respect to the nominal window center 44.

It is known to center the window by inserting a one-half VCO period delay in the input data 22 before locking the VCO signal 38 to it. The one-half period delay places the nominal window center 44 one-half way through the window 40. This delay line can be made in a combination of digital and analog form by use of a digital counter such as a chain of flip-flops or gates. Such a delay line is shown in "A 33 Mbit/sec Data Synchronizing Phase-Locked-Loop Circuit" by W. Llewellyn, M. Wong, G. Tietz, and P. Tucci as presented at the IEEE International Solid State Circuits Conference 1988. An advantage of this approach is that it is possible to "strobe" or vary the delay of the delay line by varying the current into the delay line and the circuit can operate over a wide range of data rates. Disadvantages of this approach are that it is difficult to achieve an absolute match to the center of the window since much circuitry is involved, and that large values of strobe reduce the pulse recognition performance of the data synchronizer, since the position of the delayed data is being adjusted rather than adjusting the position of the window 40 relative to the nominal window center 44.

Another known method of data synchronization is to use a VCO signal 38 and its complement or opposite phase, a −VCO signal. The VCO signal 38 is locked to the delayed input data, but the input data 22 is captured in a flip-flop clocked on the −VCO signal. In this method, window centering is controlled by the duty cycle between the VCO and −VCO signals. This duty cycle can be controlled, for example, by control of the current ratio into two legs of an emitter-coupled relaxation oscillator. In this method the window is well centered, but is difficult to strobe.

SUMMARY OF THE INVENTION

This invention performs the function of data synchronization by delaying the input data 22 for substantially one-half of the VCO signal 38 period and then comparing the phase of the delayed input data to a gated VCO signal. The phase difference is filtered and controls the frequency of the VCO signal 38 to align the VCO signal 38 with the delayed input data. The delayed input data is clocked into a flip-flop on the opposite phase of the VCO signal 38 to produce the output data 26. In a preferred embodiment the delay of the input data 22 for phase comparison, and the delay of the input data 22 for the flip-flop can be independently selected.

A structure for implementing this invention uses a PLL using a phase comparator, charge pump, filter, and VCO. A tapped delay line provides delayed input data for phase comparison with the VCO signal 38. The tapped delay line also provides delayed input data for input to a flip-flop clocked on the opposite phase of the VCO signal 38 to produce synchronized output data 26.

A data synchronizer 24 using this method or structure provides accurate window centering based on the duty cycle of the VCO signal 38 rather than based on the accuracy of the delay line. The use of a tapped delay line allows selection of a wide range of window strobe without degrading data synchronizer performance, since the time position of the data input to the phase comparator is not moved while the position of the data to the flip-flop moves with respect to the VCO signal. These and other advantages will be apparent to one skilled in the art by further consideration of the description, drawings, and claims.

DETAILED DESCRIPTION

Figure 1:
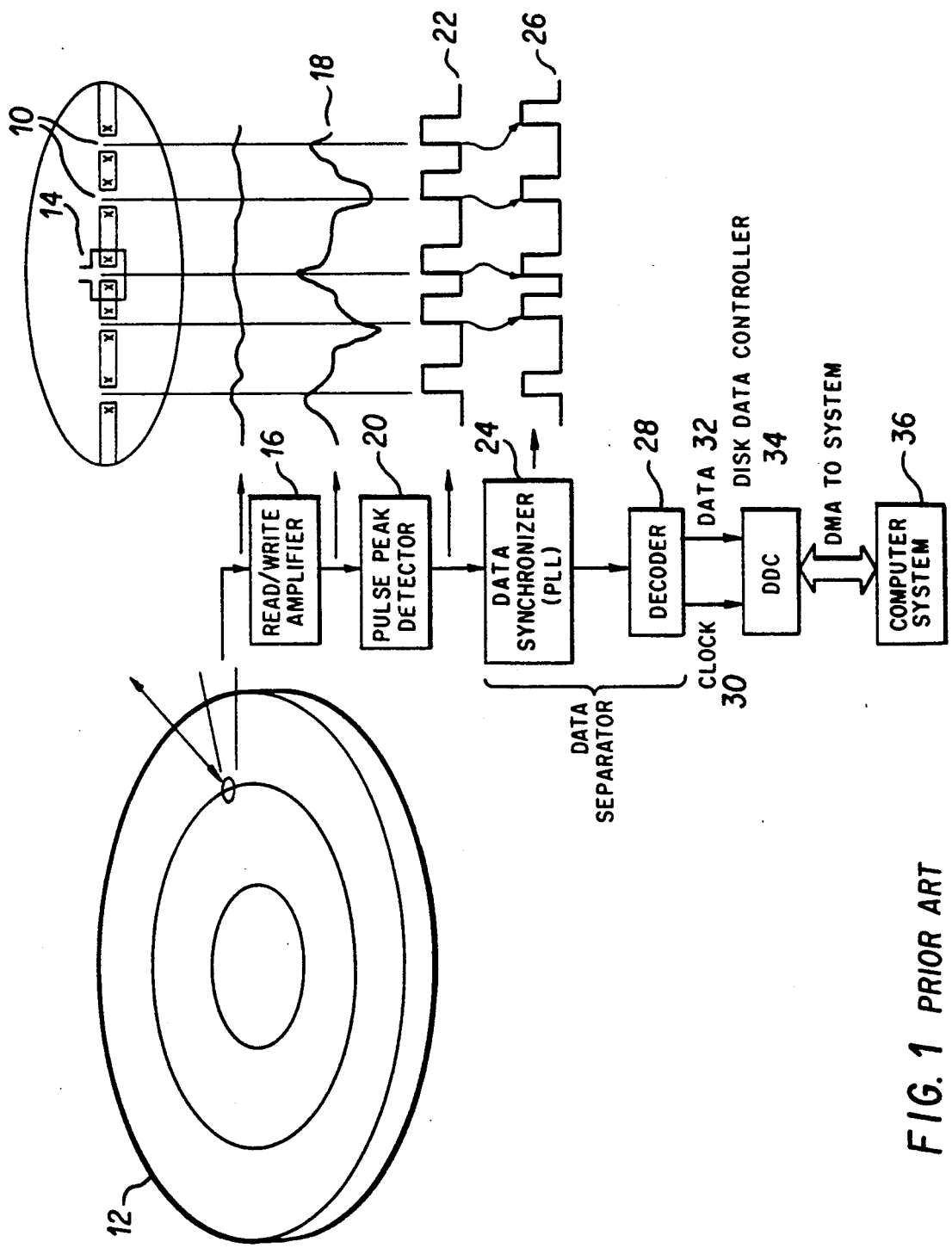
FIG. 1 illustrates the process of reading data from a computer disk drive.
Figure 2:
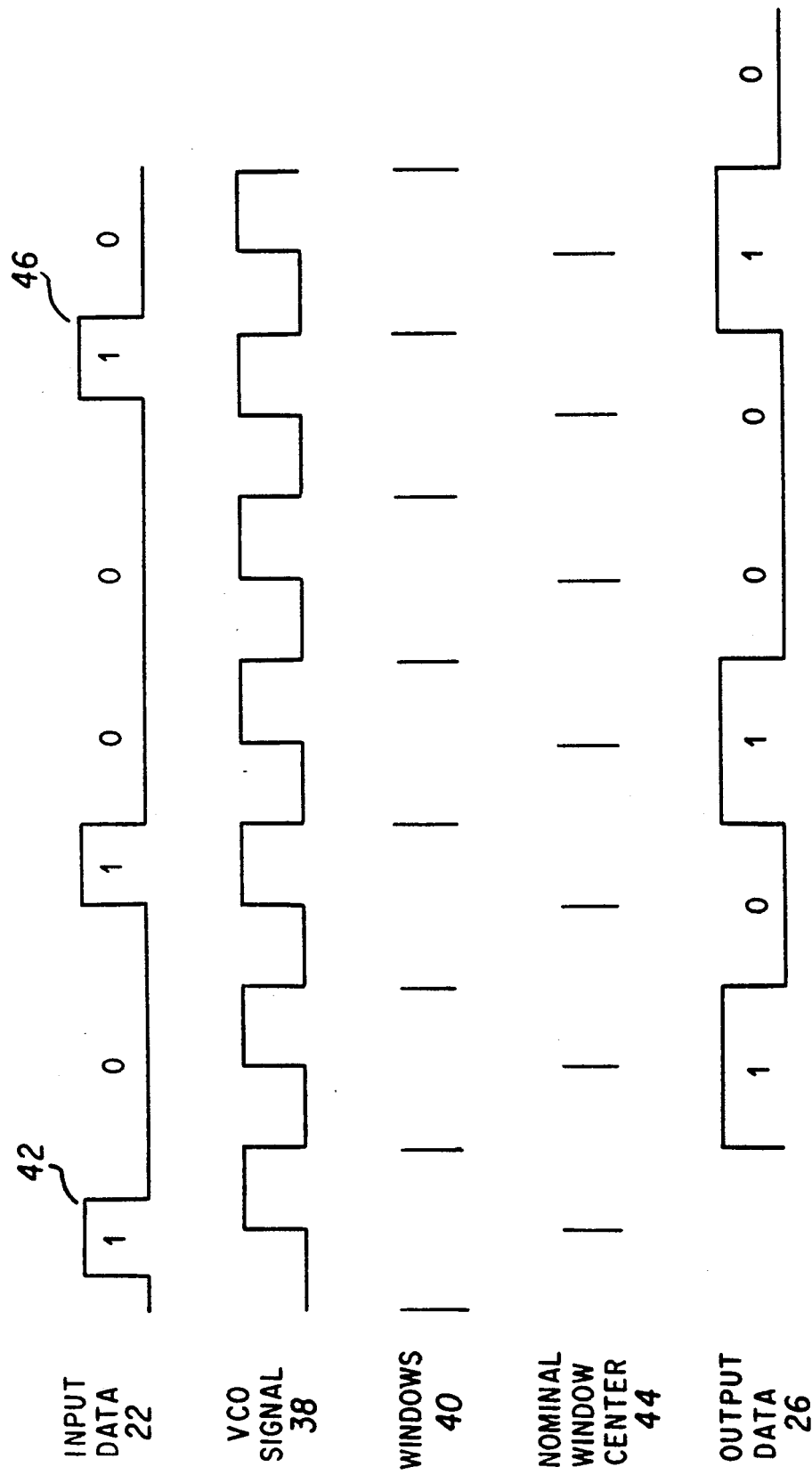
FIG. 2 shows a known approach to performing the synchronization function of the data synchronizer 24.
Figure 3:
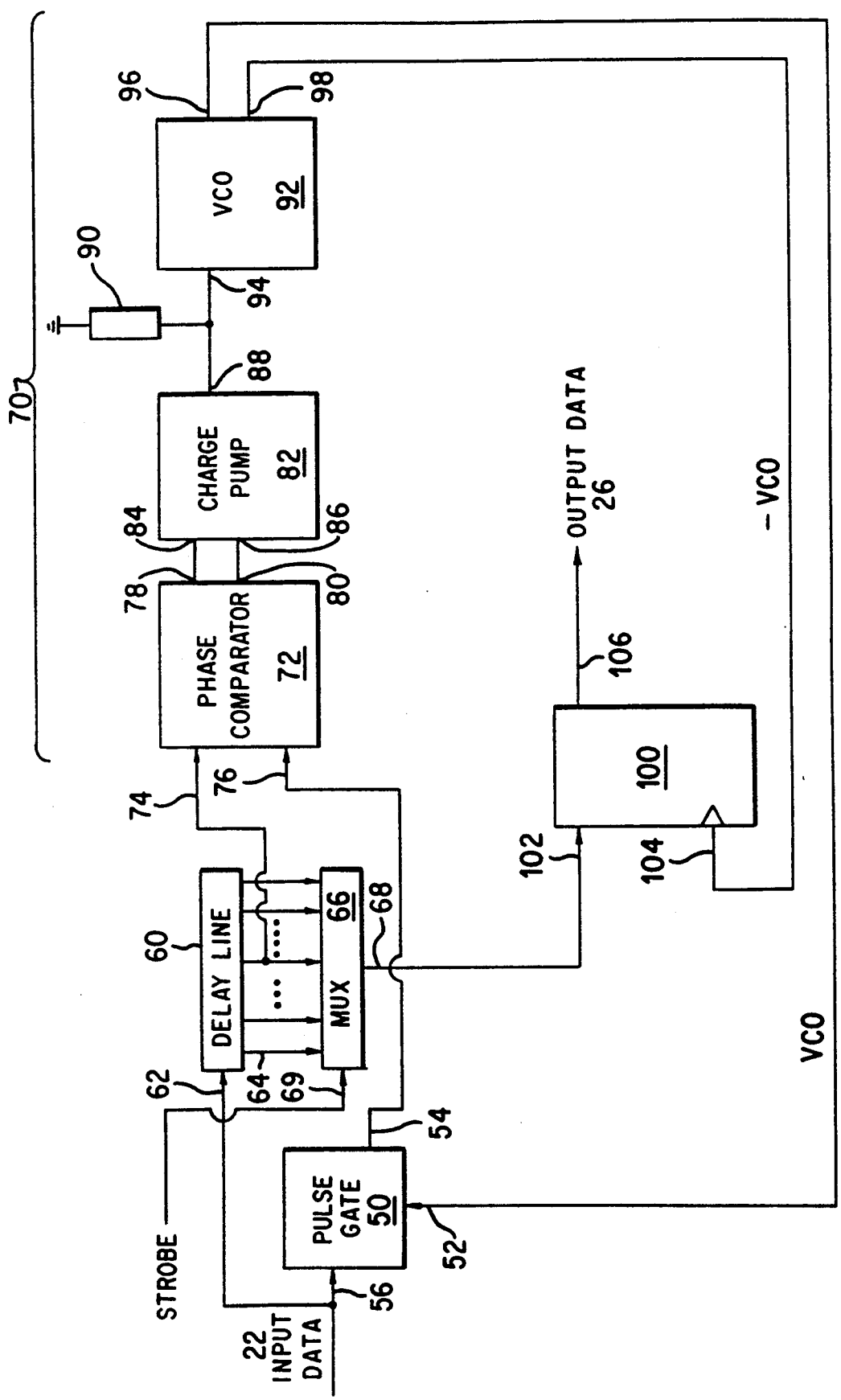
FIG. 3 shows a data synchronizer in accordance with this invention.

FIG. 3 shows a data synchronizer in accordance with this invention. The four basic elements are a pulse gate 50, delay line 60, phase lock loop (PLL) 70, and output flip-flop 100.

Beginning with PLL 70, a phase comparator 72 has a reference input 74, a gated VCO input 76, a pump-up output 78, and a pumpdown output 80. Generally, a delayed form of the input data 22 will be applied as the reference signal on reference input 74. Selected or "gated" pulses of the VCO signal 38 will be applied to the gated VCO input 76. The phase comparator 72 functions to generate a signal at the pump-up output 78 when the phase of a signal on the reference input 74 leads the phase of a signal on the gated VCO input 76. The phase comparator 72 functions to generate a signal at the pump-down output 80 when the phase of a signal on the reference input 74 lags the phase of a signal on the gated VCO input 76. Implementations of phase comparators are known in the art, such as U.S. Pat. No. 4,814,726 DIGITAL PHASE COMPARATOR/CHARGE PUMP WITH ZERO DEADBAND AND MINIMUM OFFSET to Byrd et al.

A charge pump 82 has a pump-up input 84, a pump-down input 86 and an error output 88. The charge pump 82 functions to combine the signals on its pump-up input 84 and pump-down input 86 to control the level of an error voltage at the error output 88.

The error voltage at the error output 88 is filtered by a loop filter 90 which tailors the response characteristics of the PLL 70 such as its bandwidth and damping factor.

A VCO 92 has a control input 94 and two complementary outputs, VCO output 96 and −VCO output 98. VCO output 96 provides the VCO signal 38, while −VCO output 98 provides an opposite phase version of the VCO signal 38. The VCO 92 functions to use the level of filtered error voltage received on its control input 94 to set the frequency of the VCO signal 38. The VCO signal 38 can vary in a range about the mean data rate of the input data 22 as the voltage on the control input 94 is varied. In a preferred implementation, the internal circuitry of VCO 92 oscillates at twice the frequency of VCO signal 38 and is divided by two to generate an accurate 50% duty cycle between the VCO output 96 and −VCO output 98.

When a reference signal is applied to reference input 74, and a gated VCO signal 38 is applied to gated VCO input 76, the PLL 70 functions to force the frequency and phase of the gated VCO signal 38 to match the frequency and phase of the reference signal. For the signals as described in this application, a match in frequency and phase means that the rising edges of their pulses coincide in time.

For example, if the VCO signal 38 lags the reference signal, that is, the rising edge of a pulse of the VCO signal 38 is later in time than the rising edge of a pulse of the reference signal, the phase comparator will generate a pump-up signal, which will increase the level of error voltage, and increase the frequency of the VCO signal 38. An increase in frequency of the VCO signal 38 will advance its phase until it no longer lags the reference signal.

When the VCO signal 38 is being used to define windows 40, such an advance in phase shortens the window 40 and moves the nominal window center 44 earlier in time.

A similar but oppositely directed corrective action occurs if the VCO signal 38 were to lead, rather than lag, the reference signal.

Leaving the PLL 70 and considering the other elements of the data synchronizer 24 of FIG. 3, the output flip-flop 100 is an edge triggered flip-flop with an input 102, a clock or enable input 104 and an output 106. In the data synchronizer of FIG. 3, the input 102 receives a delayed version of input data 22. The clock input receives the −VCO signal from −VCO output 98. If there is a pulse on the input 102, the flip-flop 100 will change state when clocked by the −VCO signal on clock input 104. If there is no pulse on the input 102, the flip-flop 100 will hold its state when clocked by the −VCO signal on the clock input 104. Thereby, the output flip-flop 100 functions to produce output data 26 on output 106 which is synchronized to the transitions of the −VCO signal. In other embodiments, other forms of flip-flops, latches or other storage or gate elements can be clocked to produce the output data 26.

The pulse gate 50 has an input 52, output 54, and control gate 56. The VCO signal 38 is applied to input 52 with output 54 routed to the gated VCO input 76 of the phase comparator 72. Input data 22 is applied to the control gate 56. The pulse gate 50 functions to be set by a pulse of input data 22 on its control gate 56 so as to allow the next one following pulse of VCO signal 38 to pass from input 52 to output 54. The pulse gate 50 functions to pass a pulse of the VCO signal only when there is a pulse in the input data 22, and therefore a phase comparison should be made. If during a window 40 there is no pulse in the input data 22, the pulse gate 50 will not be set, and the VCO signal 38 is blocked, preventing an erroneous phase comparison. Other forms of gating can be used to insure proper phase locking.

In a preferred embodiment, the delay line 60 has an input 62 and a plurality of output taps 64 of varying delay. One of the output taps 64 is selected for connection to the reference input 74 of the phase comparator 72. When the delay of this selected tap is one-half the period of VCO signal 38, then the VCO signal will be phase locked to one-half way through the window 40. A second output tap is selected to provide delayed input data to the output flip-flop 100. If the same output tap is selected, the window 40 will not be strobed away from the nominal window center 44. If a tap with a different delay is selected, the window will be strobed early or late from the nominal window center 44. It is preferred to have many taps of delays close to the center of the window, and fewer taps of delays farther from the center of the window. In other embodiments, two or more separate delay lines or interconnections of delay blocks can be used to select the two streams of delayed data.

In a preferred embodiment, a multiplexer 66 can select among the output taps 64 to provide a selected delayed output 68 for providing delayed input data to the output flip-flop 100. In this way the input data 22 can be sampled earlier or later in the window, providing a strobe function. The multiplexor 66 selection is controlled on a strobe input 69. When the delay line 60 is one VCO signal period long, the window can be strobed all the way to the end of the window without changing the performance of the PLL since the input to the phase comparator 72 does not change. Rather, only the relative timing between the delayed input data and −VCO signal to the flip-flop 100 is changed. This strobe range is much farther than is practicable in the prior art. Clearly, additional multiplexors or other selection means can be used, so long as delayed input data can be provided to the phase comparator 72 and output flip-flop 100. By consideration of the previously referenced paper and digital delay line, it will be apparent to one skilled in the art that by using the multiple flip-flop outputs of a ripple counter, such a tapped delay line 60 can be constructed.

The output flip-flop 100 has a data input 102, clock input 104, and data output 106. The delayed input data from multiplexor output 68 is connected to data input 102. The −VCO output 98 is connected to the clock input 104. The data output 106 will provide sychronized output data 26. The output flip-flop functions to hold the state of the delayed input data on the data input 102 when a rising edge of its clock input 104 occurs. The flip-flop then holds that state until the next rising edge on clock input 104. The state of the flip-flop can be read on output 106. In this way the delayed input data is clocked on the opposite phase of the VCO signal 38 to produce output data 26. In other embodiments, an inverter could be used to obtain the opposite phase to the VCO signal 38, or a flip-flop that clocked on a low clock signal could be substituted.

Figure 4:
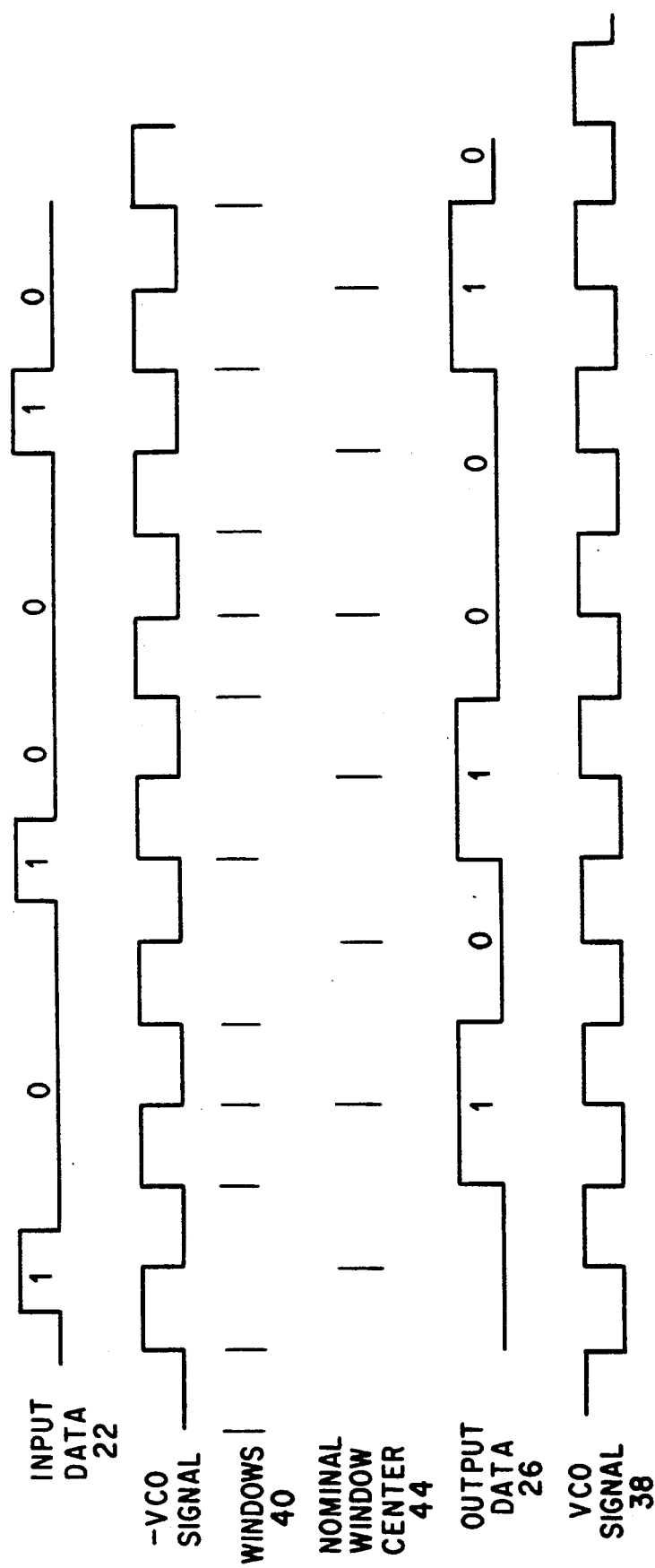
FIG. 4 shows signals illustrating the functioning of a data synchronizer in accordance with this invention.

FIG. 4 shows signals illustrating the functioning of a data synchronizer in accordance with this invention. Referring to these signals and to FIG. 3, it can be seen that input data 22 is applied to the pulse gate 50 and delay line 60. A pulse in the input data 22 will open pulse gate 50 allowing the VCO signal 38 to be compared to the delayed input data. This locks the VCO signal 38 to the delayed input data. When the delay is one-half of the period of the VCO signal 38, the rising edge of the VCO signal 38 will be centered in the window 40. A second selection of delayed input data is clocked into output flip-flop 100 by the opposite phase of the VCO signal 38 to produce output data 26. If the same delay of input data 22 is selected, and the VCO duty cycle is 50%, data will be centered in the window 40. Data can vary an equal amount early or late and still be clocked by the correct −VCO rising edge. If a shorter delay is selected, data will be able to move farther in the late direction and still be clocked by the correct −VCO rising edge. If a longer delay is selected, data can move farther in the early direction and still be clocked by the correct −VCO rising edge. In this way, window centering and strobe can be independently selected.

Other variations and embodiments of this invention will be apparent to one skilled in the art and can be employed without departing from the scope of the invention, as defined by the following claims.

I claim:

1. A data synchronizer for synchronizing input data to a VCO signal, comprising:
    a VCO with a control input and a VCO output for providing said VCO signal;
    means for receiving said input data on an input line;
    a phase comparator with a first input and second input and phase difference output, with
        said first input coupled to receive a signal from said receiving means, at a delay of substantially one-half of a VCO signal period;
        said second input coupled through a pulse gate to said VCO output, said pulse gate coupled for activation by said input data on said input line; and
        said phase difference output coupled through a filter means to said control input of said VCO;
    a flip-flop, with a data input coupled to receive a signal from said receiving means, and a clock input coupled to clock said data input on opposite phase to said VCO signal; and
    means for controlling the relative timing between the signal to said first input of said phase comparator and the signal to said data input of said flip-flop.

2. The data synchronizer as in claim 1 wherein said controlling means comprises a tapped delay line, wherein said first input of said phase comparator is coupled to a first tap and said data input of said flip-flop is coupled to a second tap of said tapped delay line.

3. A data synchronizer as in claim 2 wherein said tapped delay line is one VCO signal period long.

4. A data synchronizer as in claim 2 further comprising a means to select said second tap point from among the taps of said tapped delay line.

5. A data synchronizer as in claim 1 wherein said pulse gate is activated by said input data and allows the next following rising edge of said VCO signal to reach said second input of said phase comparator.

6. A data synchronizer as in claim 1 wherein said clock input of said flip-flop is coupled to a signal of opposite phase to said VCO signal.

7. A method for synchronizing input data to a VCO signal, comprising:
    receiving the input data on an input line;
    delaying the input data for substantially one-half of the VCO signal period;
    gating the VCO signal by the input data;
    phase comparing the delayed input data to the gated VCO signal; filtering the phase difference;
    controlling the frequency of the VCO signal with the filtered phase difference; and
    clocking delayed input data into a flip-flop on the opposite phase of the VCO signal.

8. A method as in claim 7, wherein gating the VCO signal by the input data comprises setting a pulse gate by the input data to pass the next following rising edge of the VCO signal.

9. A method as in claim 7, wherein differently delayed input data is clocked into the flip-flop.

10. A method as in claim 7, wherein clocking on the opposite phase of the VCO signal comprises clocking on a signal of opposite phase to the VCO signal.

* * * * *